United States Patent
Uchiyama et al.

(10) Patent No.: US 10,158,058 B2
(45) Date of Patent: Dec. 18, 2018

(54) METHOD FOR MANUFACTURING THERMOELECTRIC CONVERSION ELEMENT, AND THERMOELECTRIC CONVERSION ELEMENT

(71) Applicant: ATSUMITEC CO., LTD., Shizuoka (JP)

(72) Inventors: Naoki Uchiyama, Shizuoka (JP); Kazuya Kubo, Shizuoka (JP)

(73) Assignee: ATSUMITEC CO., LTD., Shizuoka (JP)

(*) Notice: Subject to any disclaimer, the term of this patent is extended or adjusted under 35 U.S.C. 154(b) by 78 days.

(21) Appl. No.: 15/115,106

(22) PCT Filed: Jan. 21, 2015

(86) PCT No.: PCT/JP2015/051562
§ 371 (c)(1),
(2) Date: Jul. 28, 2016

(87) PCT Pub. No.: WO2015/118948
PCT Pub. Date: Aug. 13, 2015

(65) Prior Publication Data
US 2017/0012191 A1    Jan. 12, 2017

(30) Foreign Application Priority Data
Feb. 4, 2014  (JP) ................. 2014-019336

(51) Int. Cl.
*H01L 35/00* (2006.01)
*H01L 37/00* (2006.01)
*H01L 35/34* (2006.01)
*H01L 35/08* (2006.01)
*H01L 35/32* (2006.01)

(52) U.S. Cl.
CPC .............. *H01L 35/08* (2013.01); *H01L 35/32* (2013.01); *H01L 35/34* (2013.01)

(58) Field of Classification Search
CPC ................................ H01L 35/32; H01L 35/34
See application file for complete search history.

(56) References Cited

U.S. PATENT DOCUMENTS

2012/0097205 A1    4/2012  Iida et al.

FOREIGN PATENT DOCUMENTS

| JP | H09148636 A | 6/1997 | |
|---|---|---|---|
| JP | 10074986 A | * 3/1998 | |
| JP | H10-074986 | * 3/1998 | ............ H01L 35/34 |

(Continued)

OTHER PUBLICATIONS

English machine translation of JPH10-74986. (Year: 2018).*

(Continued)

*Primary Examiner* — Angelo Trivisonno
(74) *Attorney, Agent, or Firm* — Kinney & Lange, P.A.

(57) ABSTRACT

To provide a manufacturing method of a thermoelectric conversion element, including: a holding step of holding thermoelectric conversion members (2, 3) while exposing at least one side end portions of at least one of the thermoelectric conversion members; a coating step of coating the exposed end portions of the thermoelectric conversion member with metal powder (13); and an electrode forming step of forming an electrode (4a) at the end portions of the thermoelectric conversion member by sintering the metal powder.

7 Claims, 10 Drawing Sheets

(56) References Cited

FOREIGN PATENT DOCUMENTS

| | | |
|---|---|---|
| JP | 2001274466 | 10/2001 |
| JP | 2001274466 A | 10/2001 |
| JP | 2006352023 | 12/2006 |
| JP | 2006352023 A | 12/2006 |
| JP | 2012134410 | 7/2012 |
| JP | 2012134410 A | 7/2012 |
| WO | 2008127017 A1 | 10/2008 |
| WO | 2010103949 A1 | 9/2010 |

OTHER PUBLICATIONS

Extended European Search Report, for European Patent Application No. 15746764.8, dated Jul. 27, 2017, 9 pages.
International Search Report and Written Opinion dated Mar. 3, 2015, for corresponding PCT Application No. PCT/JP2015/051562.

* cited by examiner

METHOD FOR MANUFACTURING THERMOELECTRIC CONVERSION ELEMENT, AND THERMOELECTRIC CONVERSION ELEMENT

TECHNICAL FIELD

The present invention relates to a method for manufacturing a thermoelectric conversion element, and the thermoelectric conversion element manufactured by the manufacturing method, and more particularly to a thermoelectric conversion element having stable thermoelectric properties and a method for manufacturing the thermoelectric conversion element.

BACKGROUND ART

A thermoelectric conversion element can convert thermal energy into electrical energy by the Seebeck effect. By using such energy conversion characteristics, exhaust heat discharged from industrial and commercial processes and movable bodies can be converted to effective power, and hence thermoelectric conversion elements have been attracting attention as energy-saving techniques in consideration of environmental problems.

In general, the thermoelectric conversion element is configured by bonding a plurality of thermoelectric conversion materials (p-type semiconductor and n-type semiconductor) to an electrode. The thermoelectric conversion element is manufactured in such a manner that a sintering material is filled in a space formed by left and right dies and upper and lower punches, and that, while the sintering material is pressed from upper and lower sides with the punches, an electric current is directly applied to the punches (pulse energization). In this way, since instead of heating the sintering furnace, Joule heat is generated by flowing the electric current, heating is performed only in a narrow range, so that sintering time is shortened and further temperature unevenness can be reduced.

Such pulse energization sintering is disclosed, for example, in Patent Document 1. Further, a method for manufacturing a thermoelectric conversion element by bonding thermoelectric conversion materials to electrodes is disclosed, for example, in Patent Document 2 (especially, see FIG. 14 in Patent Document 2).

PRIOR ART DOCUMENT

Patent Document

Patent Document 1: Japanese Patent Laid-Open No. 2003-46149
Patent Document 2: Japanese Patent Laid-Open No. 2004-221464

SUMMARY OF THE INVENTION

Problems to be Solved by the Invention

However, when the electrode is bonded to the thermoelectric conversion material made of p-type semiconductor or n-type semiconductor, bonding variations, such as bonding strength, are caused between the thermoelectric conversion material and the electrode due to dimension variations of the thermoelectric conversion material. Thereby, the bonded interface between the electrode and the thermoelectric conversion element is easily peeled, so that a portion of the interface is not bonded, or so that, although the interface is not peeled, a portion of the interface may become defective to cause variations in thermal resistance and electrical resistance of the bonded interface.

That is, when the electrode is bonded to the thermoelectric conversion material, the electrode and the thermoelectric conversion material are pressed from the upper and lower sides and supplied with an electric current. However, when the dimension variation (height variation) of the thermoelectric conversion material exists, and thereby when a state where the electrode is not bonded to the thermoelectric conversion material is caused, the interface resistance in the unbonded portion is increased, so that heat is generated at the unbonded portion and thereby the temperature of the bonded interface is partially increased. Such partial temperature rise may affect the thermoelectric characteristics of the thermoelectric conversion element. Further, when a gap is formed between the electrode and the thermoelectric conversion material, the pressing load may be concentrated on a portion of the thermoelectric conversion element, and thereby the load balance may be deteriorated.

In order to reduce the above-described dimension variation of the thermoelectric conversion material, there is a method of additionally processing the thermoelectric conversion material. Specifically, on the basis of one side end surfaces of a plurality of thermoelectric conversion materials, a grinding process or a polishing process is simultaneously applied to the other side end surfaces of the plurality of thermoelectric conversion materials, to thereby remove (reduce) the dimension variation of each of the thermoelectric conversion elements. However, when such additional processing is performed, there arises a problem that the cost of the thermoelectric conversion element is increased.

The present invention has been made in view of the above-described problems. An object of the present invention is to provide a method for manufacturing a thermoelectric conversion element, which does not require additional processing of thermoelectric conversion materials, and which can prevent the deterioration of the thermoelectric properties and the deterioration of the load balance at the time of pressing caused due to the dimension variation of each of the thermoelectric conversion materials, and is to provide the thermoelectric conversion element having excellent thermoelectric properties.

Means for Solving the Problems

In order to achieve the above-described object, a manufacturing method of a thermoelectric conversion element of the present invention included: a holding step of holding at least one thermoelectric conversion member while exposing at least one end portion of the thermoelectric conversion member; a coating step of coating the exposed end portion of the thermoelectric conversion member with metal powder; and an electrode forming step of forming an electrode at the end portion of the thermoelectric conversion member by sintering the metal powder.

Further, in order to achieve the above-described object, the thermoelectric conversion element of the present invention is characterized by including a plurality of thermoelectric conversion members arranged side by side, and an electrode bonded to each of both end portions of each of the plurality of thermoelectric conversion members, and is characterized in that at least one of the electrodes bonded to both end portions of each of the thermoelectric conversion members is formed by sintering metal powder coating the one of the end portions of each of the thermoelectric conversion members.

Advantageous Effects of the Invention

With the present invention described above, it is possible to provide a method for manufacturing a thermoelectric conversion element, which does not require additional processing of thermoelectric conversion materials and which can prevent the deterioration of the thermoelectric properties and the deterioration of the load balance at the time of pressing caused due to the dimension variation of the thermoelectric conversion materials, and it is possible to provide the thermoelectric conversion element having excellent thermoelectric properties.

MODE FOR CARRYING OUT THE INVENTION

In the following, embodiments according to the present invention will be described in detail based on embodiments with reference to the accompanying drawings. It should be noted that the present invention is not limited to the contents described below and can be implemented by being arbitrarily changed within the scope and spirit of the present invention. Further, each of the drawings used in the description of the embodiments schematically shows a thermoelectric conversion element and components thereof according to the present invention, and in order to promote better understanding, partial emphasis, enlargement, contraction, omission, or the like, is made, and hence there is a case where the scale, shape, or the like, of the thermoelectric conversion element and the components thereof are not accurately represented. Further, various numerical and quantity values used in the embodiments each shows an example and can be variously changed as needed.

Embodiment 1

(Structure of Thermoelectric Conversion Element)

Figure 1:
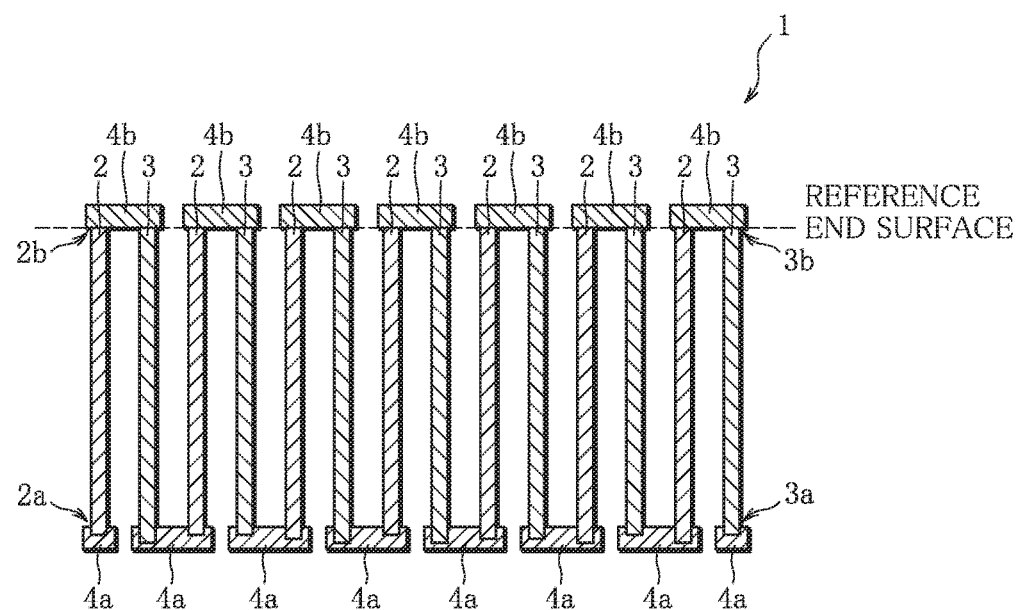
FIG. 1 is a sectional view showing an outline of a thermoelectric conversion element according to Embodiment 1.

In the following, a structure of a thermoelectric conversion element according to Embodiment 1 of the present invention 1 will be described with reference to FIG. 1. FIG. 1 is a sectional view showing an outline of a thermoelectric conversion element according to Embodiment 1. It should be noted that FIG. 1 is a sectional view along the extension direction of the thermoelectric conversion members configuring the thermoelectric conversion element.

As shown in FIG. 1, the thermoelectric conversion element 1 according to Embodiment 1 is configured by a first thermoelectric conversion member 2 made of a P-type semiconductor material, a second thermoelectric conversion member 3 made of a N-type semiconductor material, and electrodes 4a and 4b bonded to both ends of each of the first thermoelectric conversion member 2 and the second thermoelectric conversion member 3. In the present embodiment, the external shapes of the first thermoelectric conversion member 2 and the second thermoelectric conversion member 3 are the same, and the diameter and the length of each of the thermoelectric conversion members are 2 mm and 5 to 10 mm, respectively. Further, the first thermoelectric conversion member 2 and the second thermoelectric conversion member 3 are alternately arranged side by side. Also, the first thermoelectric conversion member 2 and the second thermoelectric conversion member 3, which are adjacent to each other, are electrically connected to each other by small-size electrodes 4a and 4b. That is, the thermoelectric conversion element 1 has a configuration that the first thermoelectric conversion member 2 and the second thermoelectric conversion member 3 are connected in series.

Further, as shown in FIG. 1, the electrode 4a, which is provided on a first end portion 2a side of the first thermoelectric conversion member 2 and on a first end portion 3a side of the second thermoelectric conversion member 3, covers the first end portions 2a and 3a. On the other hand, the electrode 4b, which is provided on a second end portion 2b side of the first thermoelectric conversion member 2 and a second end portion 3b side of the second thermoelectric conversion member 3, is provided in contact with the end surfaces (that is, the surfaces of the second end portions 2b and 3b) of the first thermoelectric conversion member 2 and the second thermoelectric conversion member 3. In the present embodiment, the electrode 4a is formed by sintering metal powder, and the electrode 4b is a flat copper plate. Here, the end surfaces on the side of the second end portions 2b and 3b of the first thermoelectric conversion member 2 and the second thermoelectric conversion member 3 are arranged on the same plane. That is, the interface between the first thermoelectric conversion member 2 and the electrode 4b, and the interface between the second thermoelectric conversion member 3 and the electrode 4b form a same reference end surface (shown by the broken line in FIG. 1). In other words, the ends of the first thermoelectric conversion member 2 and the second thermoelectric conversion member 3 are aligned on the reference end surface.

It should be noted that the electrode 4b is not limited to the copper plate and may be formed by sintering metal powder similarly to the electrode 4a. In this case, similarly to the electrode 4a, the electrode 4b may cover the first end portions 2a and 3a.

(Manufacturing Method of Thermoelectric Conversion Element)

Next, a manufacturing method of the thermoelectric conversion element 1 according to the present embodiment will be described with reference to FIG. 2 to FIG. 6. Each of FIG. 2 to FIG. 4, and FIG. 6 is a schematic sectional view in a manufacturing step of the thermoelectric conversion element 1 similarly shown in FIG. 1, and FIG. 5 is a schematic plan view of the electrode 4a in a manufacturing step of the thermoelectric conversion element 1.

Figure 2:
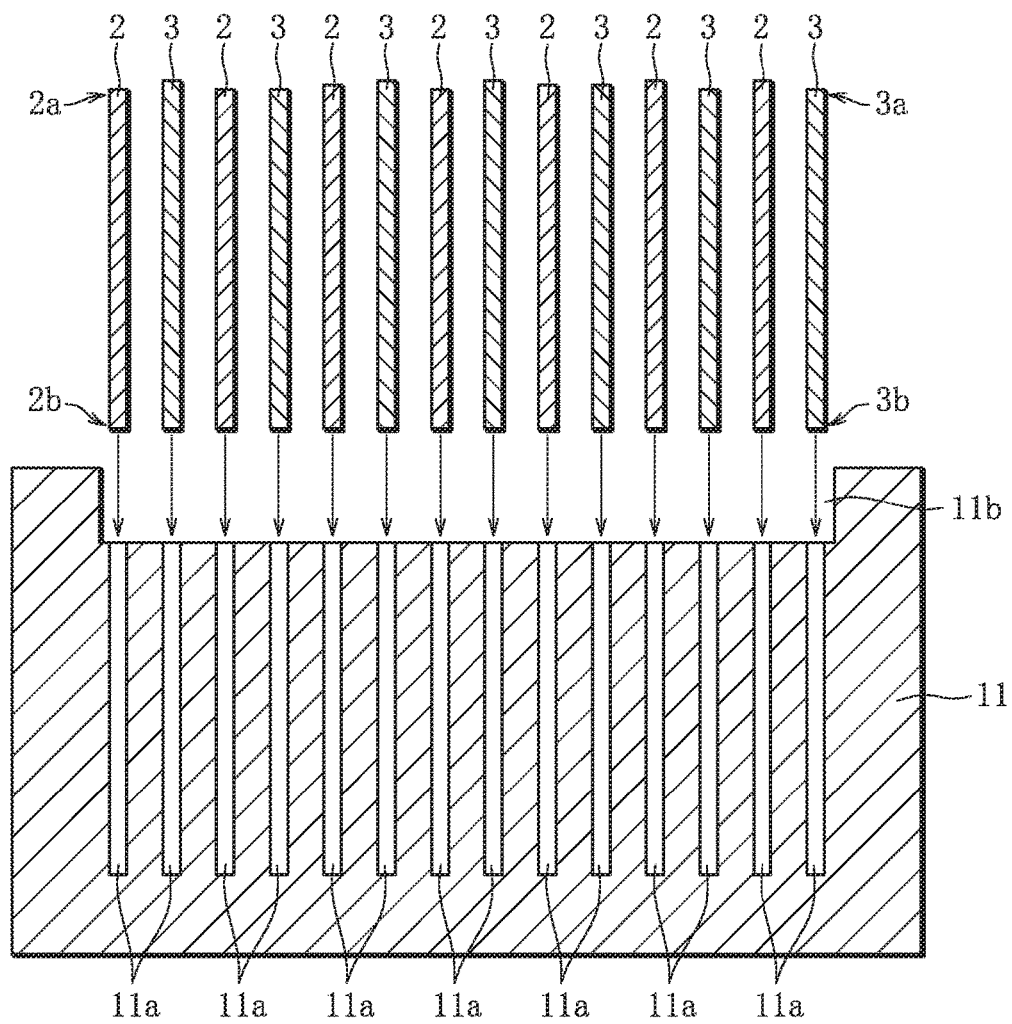
FIG. 2 is a schematic sectional view in a manufacturing step of the thermoelectric conversion element shown similarly to FIG. 1.
Figure 3:
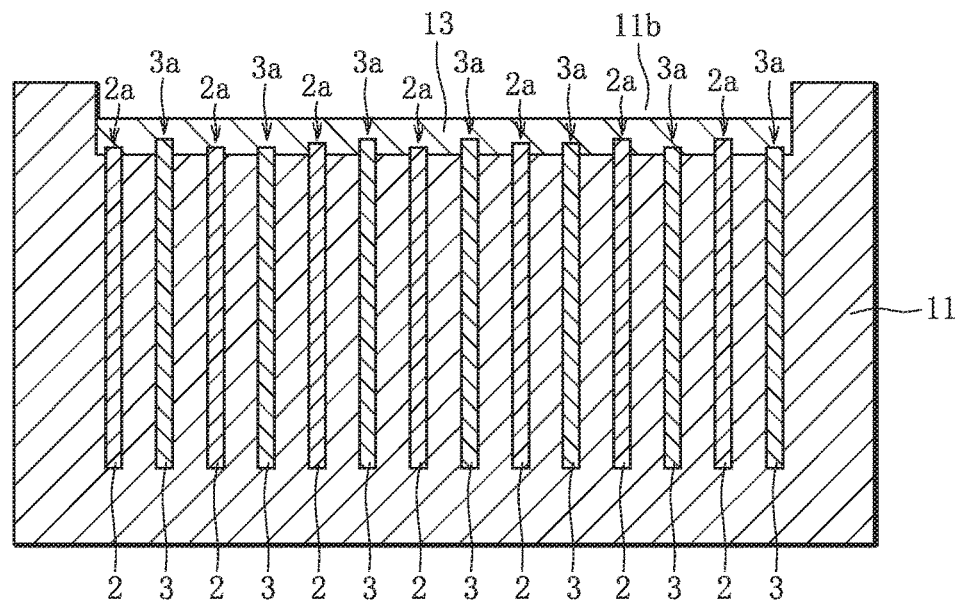
FIG. 3 is a schematic sectional view in a manufacturing step of the thermoelectric conversion element shown similarly to FIG. 1.
Figure 4:
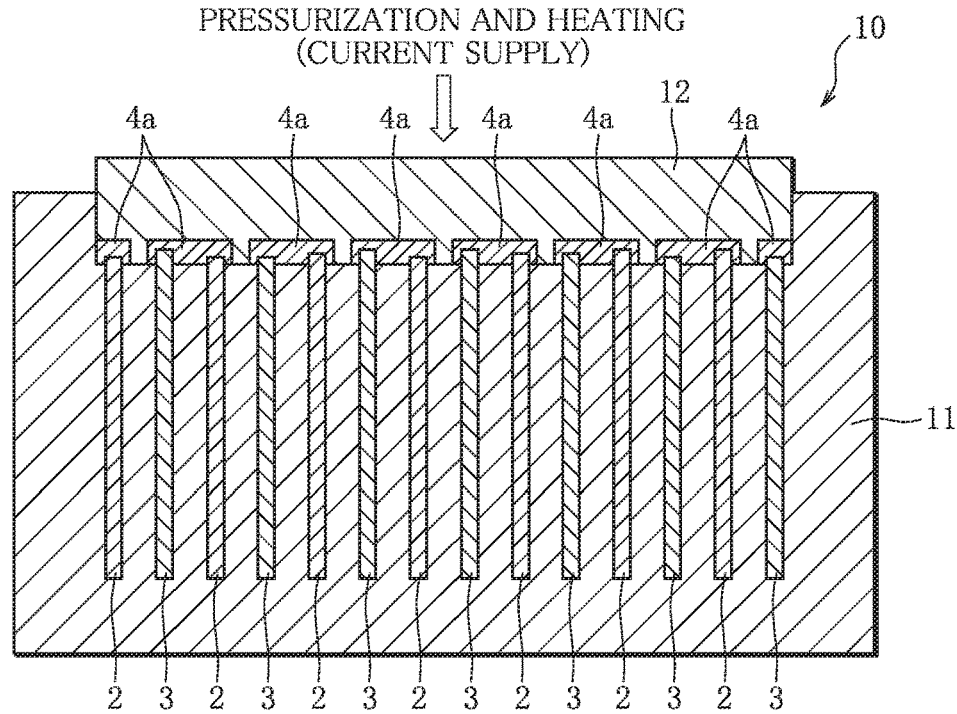
FIG. 4 is a schematic sectional view in a manufacturing step of the thermoelectric conversion element shown similarly to FIG. 1.
Figure 5:
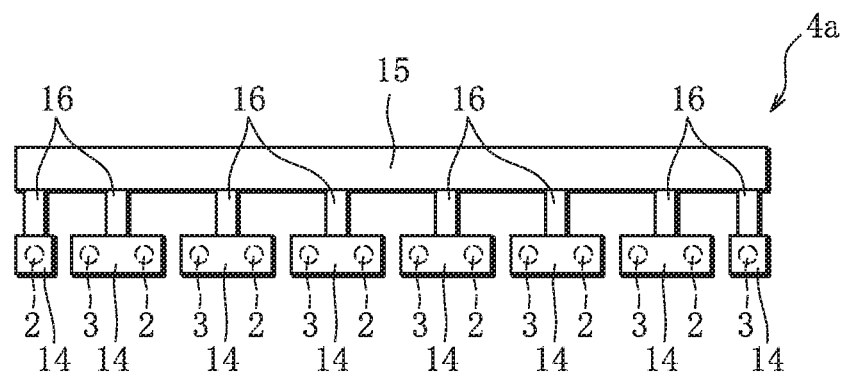
FIG. 5 is a schematic plan view showing an electrode in a manufacturing step of FIG. 4.

As can be seen from FIG. 2 to FIG. 4, a manufacturing apparatus 10 is used in order to manufacture the thermoelectric conversion element 1 in the present embodiment. The manufacturing apparatus 10 includes a holding section (dice) 11 holding the first thermoelectric conversion member 2 and the second thermoelectric conversion member 3, and a punch 12 for electrode sintering. As shown in FIG. 2, a plurality of openings 11a, into which the first thermoelectric conversion member 2 and the second thermoelectric conversion member 3 are fittingly inserted, are formed in the holding section 11. Here, the bottom surfaces of the openings 11a are located on a same plane. In other words, the depths of the openings 11a are the same. Further, a concave section 11b is formed on the forming surface side of the openings 11a in the holding section 11. The holding section 11 and the electrode sintering punch 12 are configured by a conductive material (for example, graphite).

First, as shown in FIG. 2, a holding step is performed, in which the prepared first thermoelectric conversion members 2 and the prepared second thermoelectric conversion members 3 are fittingly inserted in the openings 11a of the holding section 11 configuring the manufacturing apparatus 10, and thereby the first thermoelectric conversion members 2 and the second thermoelectric conversion members 3 are held by the holding sections 11. In the present embodiment, in the direction to which the second end portions 2b of the first thermoelectric conversion members 2 and the second end portions 3b of the second thermoelectric conversion members 3 are brought into contact with the bottom surfaces of the openings 11a, the first thermoelectric conversion members 2 and the second thermoelectric conversion members 3 are alternately fittingly inserted into the openings 11a, so that the first thermoelectric conversion members 2 and the second thermoelectric conversion members 3 are arranged side by side. Here, the depth of the opening 11a is set to be smaller than the minimum value of the standard length of the first thermoelectric conversion member 2 and the second thermoelectric conversion member 3. When the first thermoelectric conversion members 2 and the second thermoelectric conversion members 3 are fittingly inserted into the openings 11a in this way, the first end portions 2a of the first thermoelectric conversion members 2, and the first end portions 3a of the second thermoelectric conversion members 3 are located in the concave section 11b so as to be exposed (protrude) from the opening 11a. Further, the bottom surfaces of the openings 11a are set to be located on the same plane, and hence the second end portions 2b of the first thermoelectric conversion members 2, and the second end portions 3b of the second thermoelectric conversion members 3 are located on the same plane, so that the end portions of the first thermoelectric conversion members 2 and the second thermoelectric conversion members 3 are aligned. On the other hand, as shown in FIG. 2, when there is a variation in the lengths of the first thermoelectric conversion members 2 and the second thermoelectric conversion members 3, the positions of the first end portions 2a and 3a are varied.

Next, as shown in FIG. 3, a coating step is performed, in which metal powder 13 (for example, nickel and copper powder) is introduced (input) into the concave section 11b of the openings 11a so as to coat the exposed first end portions 2a and 3a. Here, the input amount of the metal powder 13 is adjusted so that all of the first end portions 2a and 3a are covered by the metal powder 13. It should be noted that the material of the metal powder 13 can be suitably changed according to the materials (that is, semiconductor materials) of the first thermoelectric conversion member 2 and the second thermoelectric conversion member 3.

Next, as shown in FIG. 4, an electrode forming step is performed, in which the electrode 4a is formed by sintering the metal powder 13. Specifically, the electrode sintering punch 12 is fitted into the opening 11a, and then, while the metal powder 13 is pressurized (pressed), an electric current is supplied to the electrode sintering punch 12 and the holding section 11 to heat the inside of the manufacturing apparatus 10. In other words, pressure treatment and heat treatment are applied to the metal powder 13. For example, when the melting point temperature of the materials of the first thermoelectric conversion member 2 and the second thermoelectric conversion member 3 is relatively high, the temperature in the manufacturing apparatus 10 may be set to about 900° C. When the melting point temperature of the materials of the first thermoelectric conversion member 2 and the second thermoelectric conversion member 3 is relatively low, the temperature in the manufacturing apparatus 10 may be set to about 600° C. to 700° C. It should be noted that, instead of supplying the electric current to the electrode sintering punch 12 and the holding section 11, the metal powder 13 may be heated and sintered by other method.

Further, recesses and projections are formed on the surface of the electrode sintering punch 12, which surface is brought into contact with the metal powder 13, and thereby the electrodes 4a are patterned by the recesses and projections. That is, when the metal powder 13 is pressurized, the overall shape of the metal powder 13 is changed into a desired pattern shape by the recesses and projections corresponding to the shapes of the first end portions 2a and 3a and the concave section 11b. Specifically, as shown in FIG. 5, the electrode 4a is partially disconnected (that is, formed to have through holes), to be configured by a plurality of small piece-shaped main body sections 14, a main connection section 15 extending from one end to the other end of the plurality of main body sections 14, and auxiliary connection sections 16 connecting the main body sections 14 and the main connection section 15. That is, in the cross section in FIG. 4, in order to prevent electrical connection between the first thermoelectric conversion members 2 and between the second thermoelectric conversion members 3, an adjacent pair of the first thermoelectric conversion member 2 and the second thermoelectric conversion member 3 are connected to each other by the main body section 14 (electrode 4a).

Figure 6:
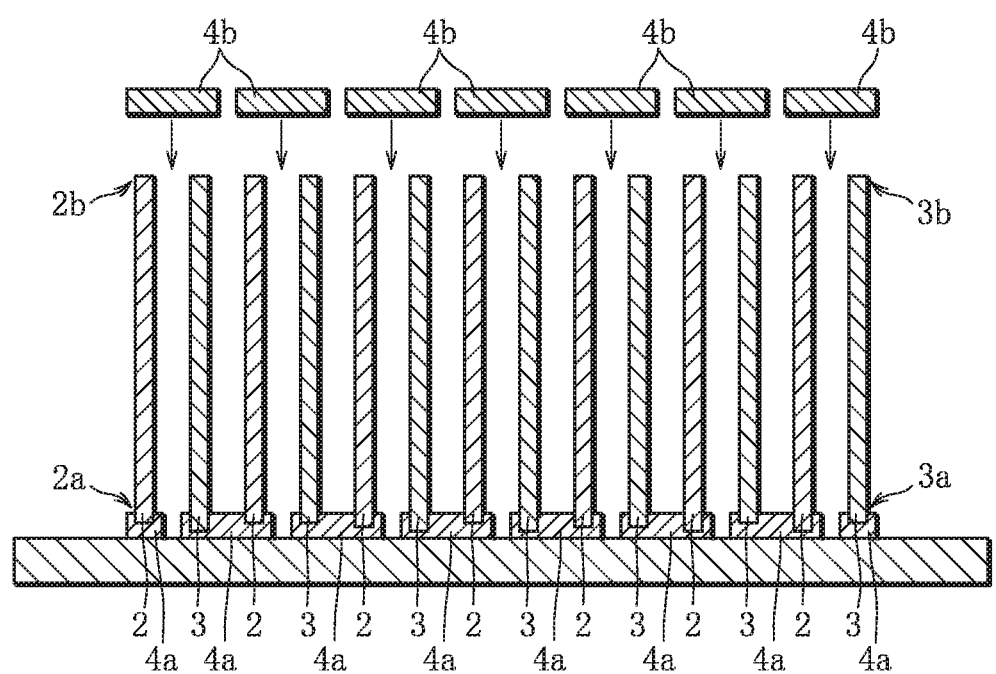
FIG. 6 is a schematic sectional view in a manufacturing step of the thermoelectric conversion element shown similarly to FIG. 1.

Next, as shown in FIG. 6, a forming step is performed, in which electrodes 4b are formed on the second end portion 2b of the first thermoelectric conversion member 2 and the second end portion 3b of the second thermoelectric conversion member 3. Specifically, the first thermoelectric conversion member 2 and the second thermoelectric conversion member 3, where are connected to the electrode 4a, are removed from the holding section 11, and are placed on a flat support base 17 as shown in FIG. 6. The first thermoelectric conversion members 2 and the second thermoelectric conversion members 3 are taken out by pinching the electrode 4a (more specifically, the main connection section 15) using, for example, a pincette. Further, when the first thermoelectric conversion member 2 and the second thermoelectric conversion member 3 are placed on the flat support base 17, the electrodes 4a are brought into contact with the support base 17. Then, a flat copper plate is bonded to the second end portions 2b and 3b, and thereby the electrode 4b is formed. The copper plate may be bonded to the second end portions 3b by using, for example, welding, or the like. Here, the electrodes 4b are already formed into small pieces, to mutually electrically connect each adjacent pair of the first thermoelectric conversion member 2 and the second thermoelectric conversion member 3. However, the electrode 4b is not electrically connected to each pair of the first thermoelectric conversion members 2 and is not electrically connected to each pair of the second thermoelectric conversion members 3. It should be noted that the manner for supporting the first thermoelectric conversion members 2 and the second thermoelectric conversion members 3 is not limited to the above-described method, and the first thermoelectric conversion members 2 and the second thermoelectric conversion members 3 may be turned and placed. In such case, the first end portions 2a and 3a are placed to be aligned along a straight line.

After the electrodes 4b are formed, the electrodes 4a are formed into small pieces (that is, the electrodes 4a are configured only by the main body sections 14) by cutting the auxiliary connection sections 16. Thereby, each adjacent pair of the first thermoelectric conversion member 2 and the second thermoelectric conversion member 3 are electrically connected to each other by the electrodes 4a, while electrically connect between each adjacent pair of the first thermoelectric conversion members 2 and electrically connect between the second thermoelectric conversion members 3 are prevented. Through the above steps, the manufacture of the thermoelectric conversion element 1 is completed.

Effects of Present Embodiment

In the manufacturing method of the thermoelectric conversion element 1 according to the present embodiment, the first thermoelectric conversion members 2 and the second thermoelectric conversion members 3 are held while the first end portions 2a of the first thermoelectric conversion members 2, and the first end portions 3a of the second thermoelectric conversion members 3 are exposed. In this state, the first end portions 2a and 3a are coated with the metal powder 13, and then the metal powder 13 is sintered to form the electrodes 4a. In this way, each of the first end portions 2a and 3a is coated with the electrodes 4a. Therefore, even when there are variations in the dimension of the first thermoelectric conversion members 2 and the second thermoelectric conversion members 3, the variations are absorbed in the manufactured thermoelectric conversion element 1. That is, in the manufacturing method of the thermoelectric conversion element 1 according to the present embodiment, without the need for applying additional processing to the thermoelectric conversion materials, the deterioration of the thermoelectric characteristics, and the deterioration of the load balance at the time of pressing due to the variations in the dimension of the thermoelectric conversion materials can be prevented, and thereby the manufacturing cost can be reduced. Further, the electrode 4a is firmly bonded to the first thermoelectric conversion member 2 and the second thermoelectric conversion member 3. That is, the bonding strength of the electrode 4a with the first thermoelectric conversion member 2 and the second thermoelectric conversion member 3 can be substantially improved.

In the manufacturing method of the thermoelectric conversion element 1 according to the present embodiment, the plurality of first thermoelectric conversion member 2 and the plurality of second thermoelectric conversion member 3 are arranged side by side in the holding step. Then, in electrode forming step, each adjacent pair of the first end portion 2a of the first thermoelectric conversion member 2 and the first end portion 3a of the second thermoelectric conversion member 3 are electrically connected to each other by the electrode 4a. Thereby, without the need for applying additional processing to the thermoelectric conversion materials, the deterioration of the thermoelectric characteristics, and the deterioration of the load balance at the time of pressing due to the variations in the dimension of the thermoelectric conversion materials can be prevented, so that the size of the thermoelectric conversion element 1 can be reduced. Further, the bonding strength of the electrode 4a with the first thermoelectric conversion member 2 and the second thermoelectric conversion member 3 can be substantially improved.

In the manufacturing method of the thermoelectric conversion element 1 according to the present embodiment, in the holding step, the second end portions 2b of the plurality of first thermoelectric conversion members 2, and the second end portions 3b of the plurality of second thermoelectric conversion members 3 are arranging on the same plane, and the first end portions 2a of the first thermoelectric conversion members 2, and the first end portions 3a of the second thermoelectric conversion members 3 are exposed. Thereby, in the state where the deterioration of the thermoelectric characteristics, and the deterioration of the load balance at the time of pressing due to the variations in the dimension of the thermoelectric conversion materials are prevented without the need for applying additional processing to the thermoelectric conversion materials, the electrode 4b arranged on the side of the second end portions 2b and 3b is brought into contact with the second end portions 2b and 3b properly (that is, in a state with no non-contact portion) so that the electrode 4b is firmly bonded to the first thermoelectric conversion member 2 and the second thermoelectric conversion member 3. That is, while the manufacturing cost is reduced, the bonding strength of the electrode 4b with the first thermoelectric conversion member 2 and the second thermoelectric conversion member 3 can be substantially improved.

In the manufacturing method of the thermoelectric conversion element 1 according to the present embodiment, in the holding step, the plurality of first thermoelectric conversion members 2 and the plurality of second thermoelectric conversion members 3 are held by the holding section 11 having the openings 11a into which the first thermoelectric conversion members 2 and the second thermoelectric conversion members 3 are fittingly inserted, and in which the bottom surfaces of the first thermoelectric conversion members 2 and the second thermoelectric conversion members 3 are arranged on the same plane. When the plurality of first thermoelectric conversion members 2 and the plurality of second thermoelectric conversion members 3 are held by using the holding section 11, the second end portions 2b of the first thermoelectric conversion members 2 and the second end portions 3b of the second thermoelectric conversion members 3 can be surely aligned on the same plane with a simple configuration and a simple step.

The thermoelectric conversion element 1 according to the present embodiment includes the plurality of first thermoelectric conversion members 2 and the plurality of second thermoelectric conversion members 3, the thermoelectric conversion members 1 and 3 being arranged side by side, and the electrode 4a bonded to each adjacent pair of one side end portions of the first thermoelectric conversion member 2 and the second thermoelectric conversion member 3, and the electrode 4b bonded to each adjacent pair of the other side end portions of the first thermoelectric conversion member 2 and the second thermoelectric conversion member 3. Further, the thermoelectric conversion element 1 is configured in such a manner that the electrode 4a bonded to each adjacent pair of the first end portion 2a of the first thermoelectric conversion member 2 and the first end portion 3a of the second thermoelectric conversion member 3 is formed by sintering the metal powder 13 provided to coat the first end portions 2a and 3a. In the state where the electrode 4a is configured in this way, even when there are variations in the dimension of the first thermoelectric conversion members 2 and the second thermoelectric conversion members 3, the variations are absorbed in the thermoelectric conversion element 1. Therefore, in the thermoelectric conversion element 1 according to the present embodiment, without the need for applying additional processing to the thermoelectric conversion materials, the deterioration of the thermoelectric characteristics, and the deterioration of the load balance at the time of pressing, due to the variations in the dimension of the thermoelectric conversion materials, can be prevented, so that the manufacturing cost can be reduced. Further, in the thermoelectric conversion element 1 according to the present embodiment, the electrodes 4a are firmly bonded to the first thermoelectric conversion member 2 and the second thermoelectric conversion member 3. That is, the bonding strength of the electrode 4a with the first thermoelectric conversion member 2 and the second thermoelectric conversion member 3 can be substantially improved.

In the thermoelectric conversion element 1 according to the present embodiment, the second end portion 2b of the first thermoelectric conversion member 2, and the second end portion 3b of the second thermoelectric conversion member 3 are arranged on the same plane. With this configuration, without the need for applying additional processing to the thermoelectric conversion materials, it is possible to prevent the deterioration of the thermoelectric characteristics, and the deterioration of the load balance at the time of pressing, due to the variations in the dimension of the thermoelectric conversion materials. Also, with this configuration, the electrode 4b arranged on the side of the second end portions 2b and 3b is brought into contact with the second end portions 2b and 3b properly (that is, in a state with no non-contact portion), and thereby the electrode 4b is firmly bonded to the first thermoelectric conversion member 2 and the second thermoelectric conversion member 3. That is, the bonding strength of the electrode 4b with the first thermoelectric conversion member 2 and the second thermoelectric conversion member 3 can be substantially improved, while the manufacturing cost is reduced.

From the above, with the present embodiment, it is possible to provide the method for manufacturing the thermoelectric conversion element 1, which can prevent the deterioration of the thermoelectric properties and the deterioration of the load balance at the time of pressing, due to dimensional variations of the first thermoelectric conversion member 2 and the second thermoelectric conversion member 3, and it is possible to provide the thermoelectric conversion element 1 having excellent thermoelectric properties.

Embodiment 2

Figure 7:
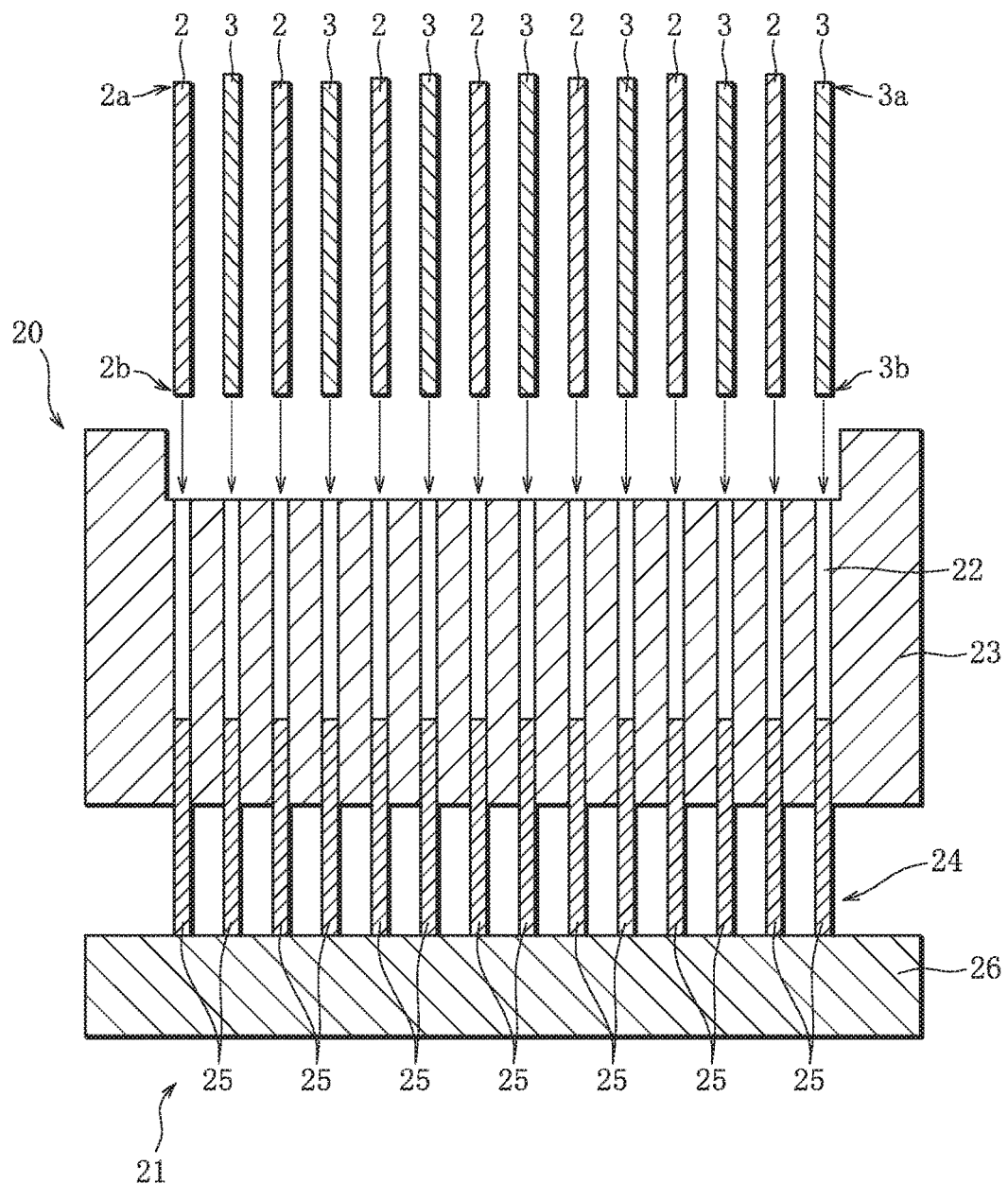
FIG. 7 is a schematic sectional view in a manufacturing step of the thermoelectric conversion element shown similarly to FIG. 1.

In Embodiment 1 described above, the second end portion 2b of the first thermoelectric conversion member 2, and the second end portion 3b of the second thermoelectric conversion member 3 are brought into contact with the bottom surface of the holding section 11 of the manufacturing apparatus 10, and thereby the second end portions 2b and 3b are aligned on the same plane. However, the second end portions 2b and 3b may also be aligned on the same plane by the method as shown in FIG. 7. FIG. 7 is a schematic sectional view showing a manufacturing step of the thermoelectric conversion element 1 shown in the same manner as in FIG. 1. It should be noted that the steps, other than the step in which the first thermoelectric conversion member 2 and the second thermoelectric conversion member 3 are held by a manufacturing apparatus, are the same as the steps of Embodiment 1 described above, and hence the descriptions other than the description of the holding step is omitted.

As shown in FIG. 7, a holding section 21 of a manufacturing apparatus 20 in Embodiment 2 is configured by a fitting insertion section 23 having through holes 22 into which the first thermoelectric conversion members 2 and the second thermoelectric conversion members 3 are fittingly inserted, and a positioning section 24 which is brought into contact with the first thermoelectric conversion members 2 and the second thermoelectric conversion members 3 and thereby positions the first thermoelectric conversion members 2 and the second thermoelectric conversion members 3. Further, the positioning section 24 is configured by a plurality of pin punches 25 which are fittingly inserted into the through holes 22, and a pedestal 26 which holds the pin punches 25. Further, the plurality of pin punches 25 have the same length, and the pedestal 26 has a flat surface on which the pin punches 25 are held. Therefore, one ends of the pin punches 25, which ends are not held by the pedestal 26, are aligned and located on the same plane. Here, the pin punch 25 is made of a metal material, such as iron or copper, which can be easily processed, and the pedestal is made of graphite.

When the first thermoelectric conversion members 2 and the second thermoelectric conversion members 3 are fittingly inserted into the through holes 22, the second end portions 2b and 3b are brought into contact with the pin punches 25, so that the end portions of the first thermoelectric conversion members 2 and the second thermoelectric conversion members 3 are aligned. In other words, the second end portions 2b and 3b are positioned by contact with the pin punches 25, and thereby the reference end surface of the first thermoelectric conversion member 2 and the second thermoelectric conversion member 3 is formed.

It should be noted that, in the forming step of the electrode 4a, pressurization is performed by the electrode sintering punch 12 and the pin punch 25.

In the manufacturing method of the present embodiment, the first thermoelectric conversion members 2 and the second thermoelectric conversion members 3 are held by using the manufacturing apparatus 20 provided with the holding section 21 described above. Therefore, in addition to the effect of Embodiment 1 described above, the present embodiment has an effect that the thermoelectric conversion element 1 can be manufactured flexibly corresponding to the dimension of the first thermoelectric conversion member 2 and the second thermoelectric conversion member 3.

Further, in the manufacturing method of the present embodiment, the first thermoelectric conversion member 2 and the second thermoelectric conversion member 3 are held by using the manufacturing apparatus 20 provided with the holding section 21 as described above. Therefore, when, after the electrodes 4a are formed on the first thermoelectric conversion members 2 and the second thermoelectric conversion members 3, the pin punches 25 are moved in the pressing direction (that is, the pin punches 25 are pressed toward the first thermoelectric conversion members 2 and the second thermoelectric conversion members 3), the first thermoelectric conversion members 2 and the second thermoelectric conversion members 3 can be easily taken out in the state where the electrodes 4a are formed on the first thermoelectric conversion members 2 and the second thermoelectric conversion members 3.

Embodiment 3

The thermoelectric conversion element of the present invention is not limited to the thermoelectric conversion elements 1 according to Embodiment 1 and Embodiment 2 described above, and all the electrodes located on the both ends of the thermoelectric conversion members may also be formed to coat the end portions of thermoelectric conversion member. That is, all the electrodes may be formed of metal powder. In the following, the structure and manufacturing method of a thermoelectric conversion element 101 configured in this way as Embodiment 3 will be described with reference to FIG. 8 to FIG. 14.

(Structure of Thermoelectric Conversion Element)

Figure 8:
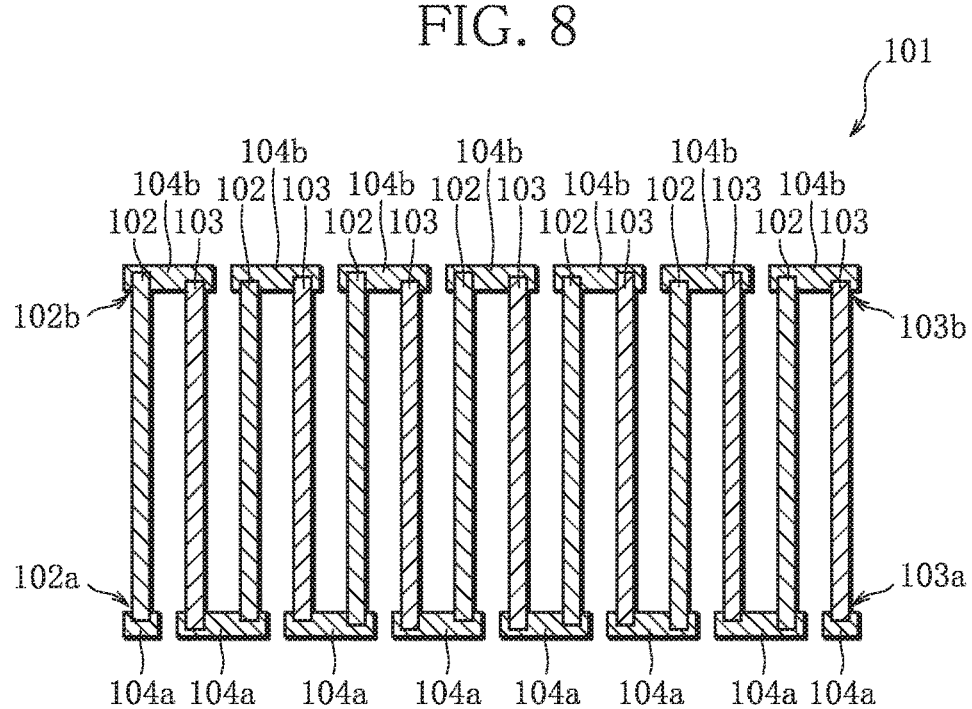
FIG. 8 is a sectional view showing an outline of a thermoelectric conversion element according to Embodiment 3.

First, the structure of the thermoelectric conversion element 101 according to Embodiment 3 of the present invention will be described with reference to FIG. 8. FIG. 8 is a sectional view showing an outline of the thermoelectric conversion element according to Embodiment 3. It should be noted that FIG. 8 is a sectional view taken along the extension direction of the thermoelectric conversion members configuring the thermoelectric conversion element 101.

As shown in FIG. 8, the thermoelectric conversion element 101 according to Embodiment 3 includes first thermoelectric conversion members 102 made of a P-type semiconductor material, second thermoelectric conversion members 103 made of a N-type semiconductor material, and electrodes 104a and 104b provided on both ends of each of the first thermoelectric conversion member 102 and the second thermoelectric conversion member 103. In the present embodiment, the external shape of the first thermoelectric conversion member 102 is the same as that of the second thermoelectric conversion member 103, and the diameter and length of each of the first and second thermoelectric conversion members are 2 mm and 5 to 10 mm, respectively. Further, the first thermoelectric conversion member 102 and the second thermoelectric conversion member 103 are alternately arranged side by side. Each adjacent pair of the first thermoelectric conversion member 102 and the second thermoelectric conversion member 103 are electrically connected to each other by the electrodes 104a and 104b each of which is cut into a small piece. That is, similarly to the thermoelectric conversion element 1 of Embodiment 1, the thermoelectric conversion element 101 has a configuration in which the first thermoelectric conversion member 2 and the second thermoelectric conversion member 3 are connected in series.

Further, as shown in FIG. 8, each of the electrodes 104a and 104b, which are respectively provided on both ends of each of the first thermoelectric conversion member 102 and the second thermoelectric conversion member 103, covers each end portions (covers each of first end portions 102a and 103a, and covers each of second end portions 102b and 103b). In the present embodiment, the electrodes 104a and 104b are formed by sintering metal powder. It should be noted that, in the thermoelectric conversion element 101 of the present embodiment, the reference end surface as formed in Embodiment 1 is not formed, and the positions of the end portions may not be aligned.

(Manufacturing Method of Thermoelectric Conversion Element)

Figure 9:
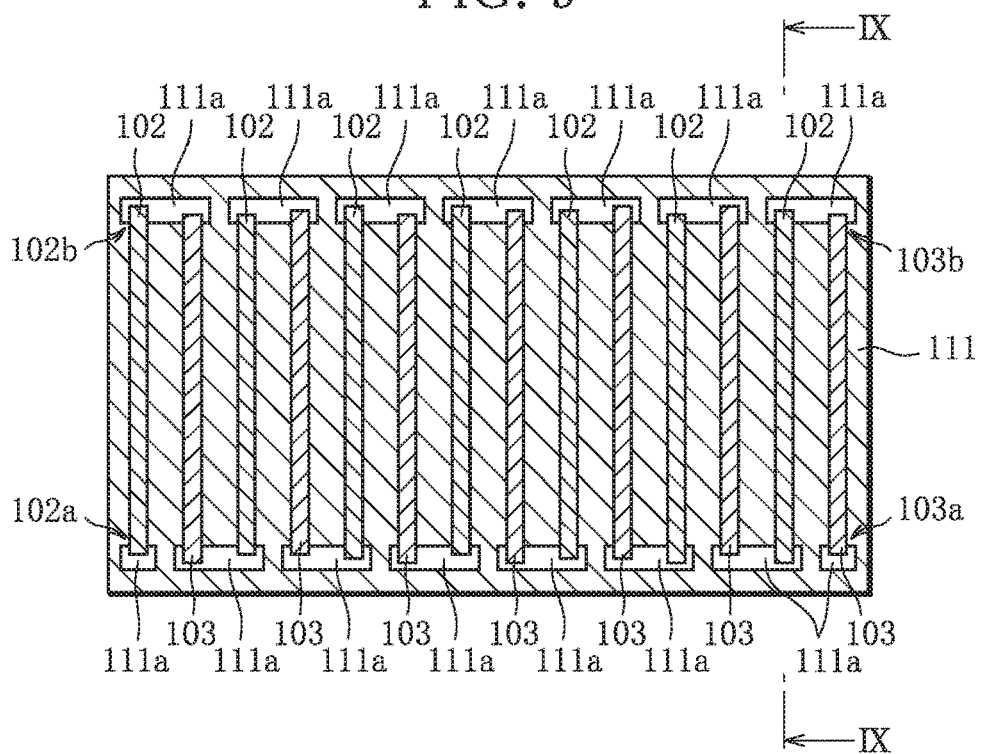
FIG. 9 is a schematic sectional view in a manufacturing step of the thermoelectric conversion element shown similarly to FIG. 8.

Next, the manufacturing method of the thermoelectric conversion element 101 according to present embodiment will be described with reference to FIG. 9 to FIG. 14. FIG. 9 is a schematic sectional view in a manufacturing step of the thermoelectric conversion element 101 shown similarly to FIG. 8. Each of FIG. 10 to FIG. 14 is a sectional view taken along the line IX-IX of FIG. 9 and a schematic sectional view in a manufacturing step of the thermoelectric conversion element 101.

As can be seen from FIG. 9 to FIG. 14, a manufacturing apparatus 110 is used to manufacture the thermoelectric conversion element 101 in the present embodiment. The manufacturing apparatus 110 includes a first holding section (dice) 111 and a second holding section (dice) 112 which hold the first thermoelectric conversion member 102 and the second thermoelectric conversion member 103, a plurality of electrode sintering punches 113, and two pedestals 114 which supports the electrode sintering punches. Further, the first holding section 111 is provided with a pair of through holes 111a, and the second holding section 112 is provided with a pair of through holes 112a. The through holes 111a and the through holes 112a are used for exposing both ends of the first thermoelectric conversion member 102 and both ends of the second thermoelectric conversion member 103 when the first thermoelectric conversion member 102 and the second thermoelectric conversion member 103 are held by the first holding section 111 and the second holding section 112. Further, a concave section 111b, in which the first thermoelectric conversion member 102 and the second thermoelectric conversion member 103 are mounted, is formed in the first holding section 111, and a convex section 112b, which is fitted into the concave section 111b, is formed on the second holding section 112. Here, when the convex section 112b of the second holding section 112 is fitted into the concave section 111b of the first holding section 111, the through hole 111a and the through hole 112a, which face each other, communicate with each other. In the present embodiment, the first holding section 111, the second holding section 112, the electrode sintering punch 113, and the pedestal 114 are formed of a conductive material (for example, graphite).

Figure 10:
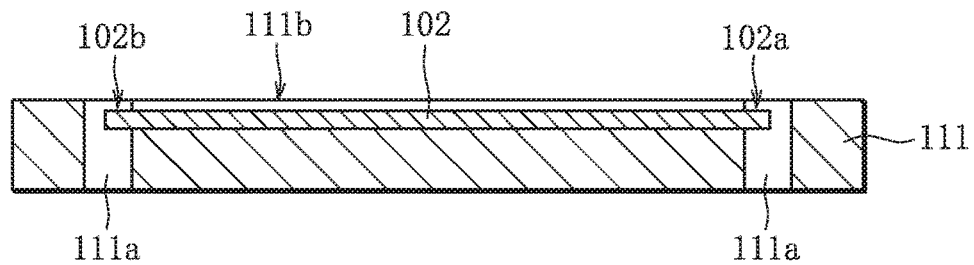
FIG. 10 is a sectional view taken along the line IX-IX of FIG. 9 and a schematic sectional view in a manufacturing step of the thermoelectric conversion element.

First, as shown in FIG. 9 and FIG. 10, the prepared first thermoelectric conversion member 102 and the prepared second thermoelectric conversion member 103 are mounted in the concave section 111b of the first holding section 111 configuring the manufacturing apparatus 110. At the time of mounting, the first end portion 102a and the second end portion 102b of the first thermoelectric conversion member 102, and the first end portion 103a and the second end portion 103b of the second thermoelectric conversion member 103 are exposed in the portion formed as the through hole 111a.

Figure 11:
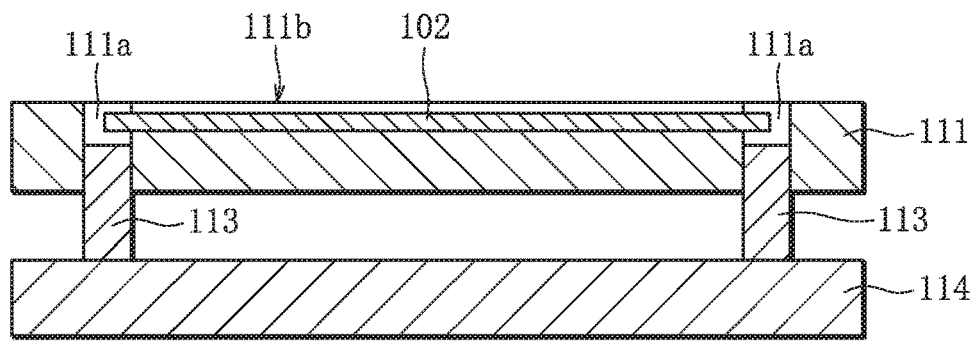
FIG. 11 is a sectional view taken along the line IX-IX of FIG. 9 and a schematic sectional view in a manufacturing step of the thermoelectric conversion element.

Next, as shown in FIG. 11, the electrode sintering punch 113 is fittingly inserted into the through hole 111a of the first holding section 111. At this time, the position of the electrode sintering punch 113 is adjusted so that the electrode sintering punch 113 is not brought into contact with the first thermoelectric conversion member 102 and the second thermoelectric conversion member 103.

Figure 12:
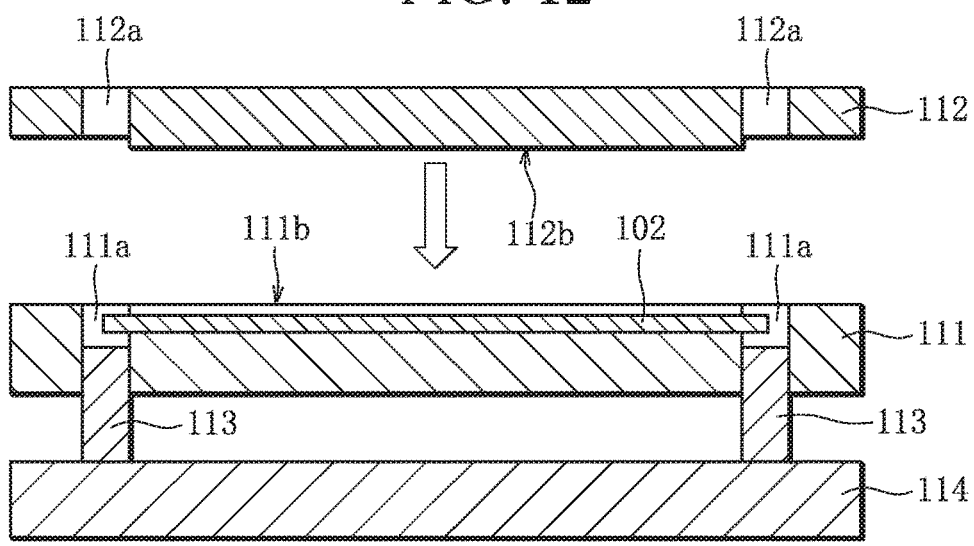
FIG. 12 is a sectional view taken along the line IX-IX of FIG. 9 and a schematic sectional view in a manufacturing step of the thermoelectric conversion element.

Next, as shown in FIG. 12, the second holding section 112 is fittingly inserted into the first holding section 111. Specifically, the convex section 112b of the second holding section 112 is fittingly inserted into the concave section 111b of the first holding section 111, and the first thermoelectric conversion member 102 and the second thermoelectric conversion member 103 are sandwiched between the first holding section 111 and the second holding section 112. At this time, the through hole 111a and the through hole 112a communicate with each other, and both ends of the first thermoelectric conversion member 102 and both ends of the second thermoelectric conversion member 103 are exposed in the portion formed by the through holes 111a and 112a.

Through the above-described steps, the holding step of the first thermoelectric conversion member 102 and the second thermoelectric conversion member 103 is completed. It should be noted that the order of the step of fittingly inserting the electrode sintering punch 113 into the first holding section 111, and the step of fittingly inserting the second holding section 112 into the first holding section 111 may be changed.

Figure 13:
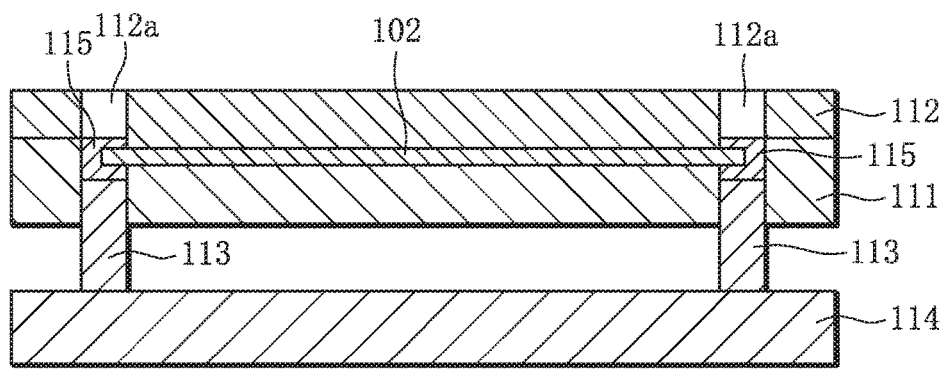
FIG. 13 is a sectional view taken along the line IX-IX of FIG. 9 and a schematic sectional view in a manufacturing step of the thermoelectric conversion element.

Next, as shown in FIG. 13, a coating step is performed, in which metal powder 115 (for example, nickel powder or copper powder) is put into the through holes 111a and 112a to coat the exposed both ends of the first thermoelectric conversion member 102 and of the second thermoelectric conversion member 103. Here, the input amount of the metal powder 115 is suitably set so that the metal powder 115 does not overflow the through hole 112a.

Figure 14:
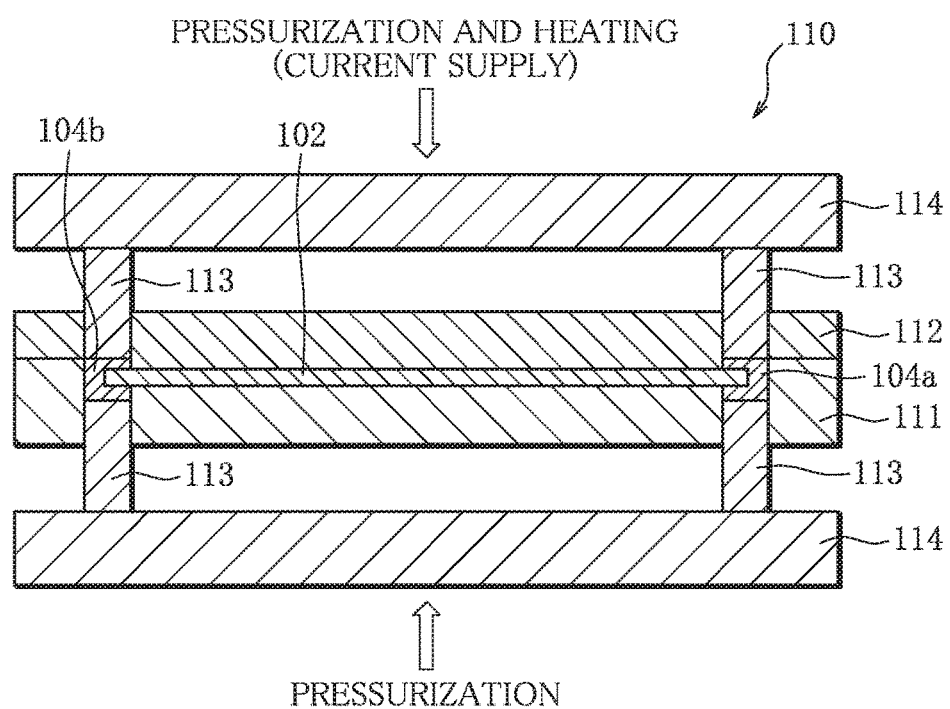
FIG. 14 is a sectional view taken along the line IX-IX of FIG. 9 and a schematic sectional view in a manufacturing step of the thermoelectric conversion element.

Next, as shown in FIG. 14, an electrode forming step is performed, in which the electrodes 104a and 104b are simultaneously formed by sintering the metal powder 115. Specifically, the electrode sintering punch 113 is fittingly inserted into the through hole 112a of the second holding section 112, so that the metal powder 115 is surrounded by the first holding section 111, the second holding section 112, and the electrode sintering punch 113. Thereafter, the metal powder 115 is pressurized (pressed) by the electrode sintering punch 113, and then an electric current is supplied to the electrode sintering punch 113 to heat the inside of the manufacturing apparatus 110. In other words, the metal powder 115 is subjected to pressure treatment and heat treatment. The heating temperature is the same as that in Embodiment 1.

In the present embodiment, in the state where the first thermoelectric conversion member 102 and the second thermoelectric conversion member 103 are held by the first holding section 111 and the second holding section 112, the end portions of each adjacent pair of the first thermoelectric conversion member 102 and the second thermoelectric conversion member 103 are exposed by the through holes 111a and 112a communicating each other. For this reason, the electrodes 104a and 104b are formed in the through holes 111a and 112a, and thereby each adjacent pair of the first thermoelectric conversion member 102 and the second thermoelectric conversion member 103 are electrically connected to each other.

Next, after the metal powder 115 is sintered, the formed thermoelectric conversion element 101 is taken out from the manufacturing apparatus 110. Similarly to Embodiment 1, the first thermoelectric conversion members 102 and the second thermoelectric conversion members 103 are taken out by pinching the electrodes 104a and 104b with, for example, a pincette.

Through the above steps, the manufacture of the thermoelectric conversion element 101 is completed.

Effect of Present Embodiment

In the manufacturing method of the thermoelectric conversion element 101 of the present embodiment, while both ends portions of the first thermoelectric conversion member 102 and both ends portions of the second thermoelectric conversion member 103 are exposed, the first thermoelectric conversion member 102 and the second thermoelectric conversion member 103 are held, and then the metal powder 115 is sintered. Thereby, the electrode 104a is formed at one end portions of each adjacent pair of the first thermoelectric conversion member 102 and the second thermoelectric conversion member 103, and at the same time, the electrode 104b is formed at other end portions of the each adjacent pair of the first thermoelectric conversion member 102 and the second thermoelectric conversion member 103. When such manufacturing step is used, the electrode 104b can be more firmly and surely bonded to the first thermoelectric conversion member 102 and the second thermoelectric conversion member 103 as compared with Embodiment 1 and Embodiment 2 described above. Further, the electrodes 104a and 104b can be simultaneously formed, and hence the manufacturing steps and cost can be further reduced.

Further, the alignment of the end portions of the first thermoelectric conversion members 102 and the second thermoelectric conversion members 103 is not needed, and hence the manufacturing steps and cost can be further reduced.

Embodiment 4

Figure 15:
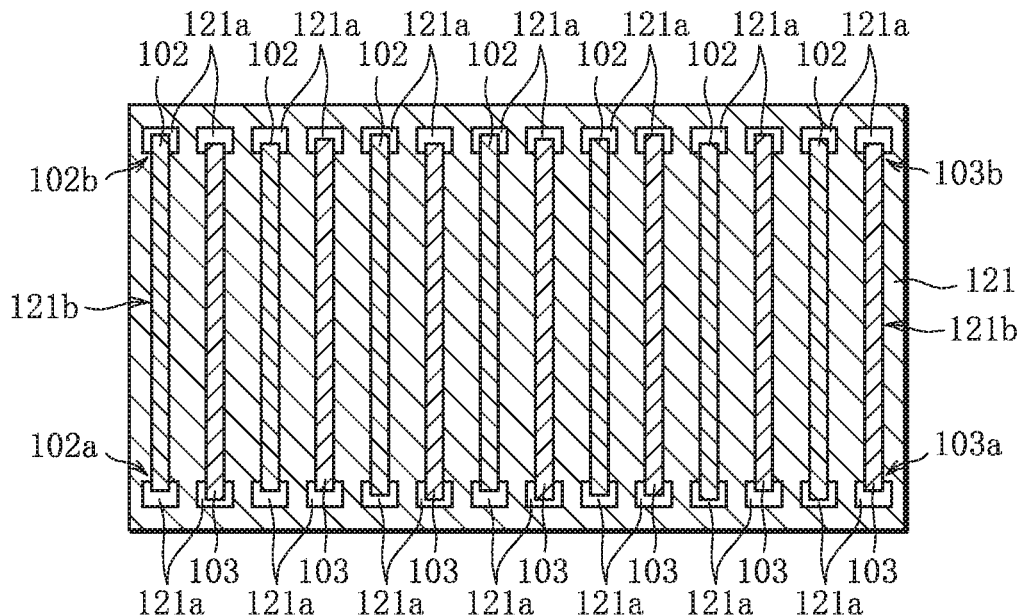
FIG. 15 is a schematic sectional view in a manufacturing step of the thermoelectric conversion element shown similarly to FIG. 9.
Figure 16:
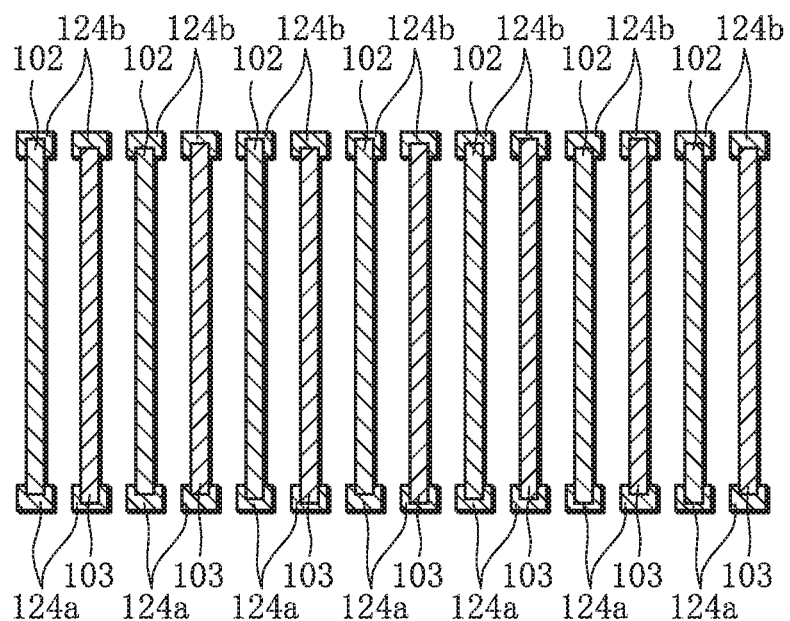
FIG. 16 is a schematic sectional view in a manufacturing step of the thermoelectric conversion element shown similarly to FIG. 9.
Figure 17:
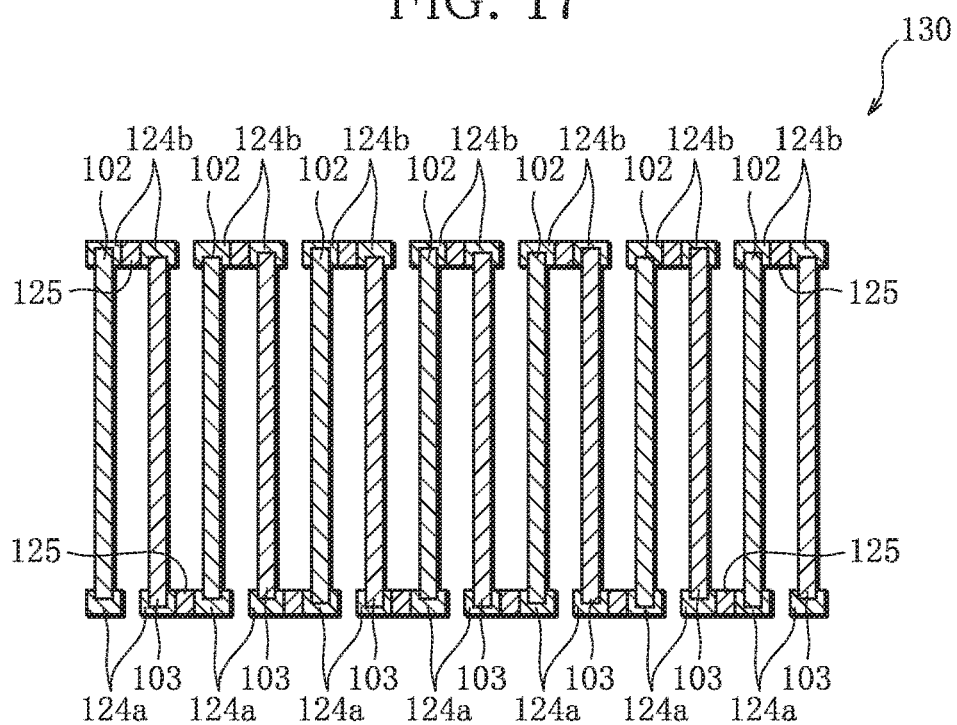
FIG. 17 is a schematic sectional view in a manufacturing step of the thermoelectric conversion element shown similarly to FIG. 9.

In Embodiment 3 described above, when the electrodes 104a and 104b are formed by sintering the metal powder 115, each of the electrodes 104a and 104b mutually electrically connects an adjacent pair of the first thermoelectric conversion member 102 and the second thermoelectric conversion member 103. However, when the metal powder 115 is sintered, a separate electrode may be formed at each of the first thermoelectric conversion member 102 and the second thermoelectric conversion member 103. In the following, a manufacturing method including such manufacturing step will be described with reference to FIG. 15 to FIG. 17. Here, each of FIG. 15 to FIG. 17 is a schematic sectional view in a manufacturing step of a thermoelectric conversion element shown similarly to FIG. 9. It should be noted that the descriptions of steps which are the same as those in Embodiment 3 is omitted.

First, as shown in FIG. 15, the prepared first thermoelectric conversion members 102 and the prepared second thermoelectric conversion members 103 are mounted in concave sections 121b of a first holding section 121 configuring a manufacturing apparatus. At the time of mounting, the first end portion 102a and the second end portion 102b of the first thermoelectric conversion member 2, and the first end portion 103a and the second end portion 103b of the second thermoelectric conversion member 103 are exposed in portions formed as through holes 121a. Here, the through holes 121a are arranged at both ends of the mounting position of the first thermoelectric conversion member 102 and also arranged at both ends of the mounting position of the second thermoelectric conversion member 103. That is, the through hole 121a is formed at each of both end portions of the concave section 121b.

Then, similarly to Embodiment 3 described above, the holding step of the first thermoelectric conversion member 102 and the second thermoelectric conversion member 103 is performed by fittingly inserting the electrode sintering punches and the second holding section. In this case, the through hole of the second holding section corresponds to the through hole 121a of the first holding section 121. That is, the through hole of the second holding section is arranged at each of both ends of the convex section which is fittingly inserted into the concave section 121b of the first holding section 121. The through hole 121a of the first holding section 121, and the through hole of the second holding section communicate with each similarly to Embodiment 3.

Then, similarly to Embodiment 3 described above, the metal powder is input and sintered, and thereby electrodes 124a and 124b are separately formed at both end portions of each of the first thermoelectric conversion member 102 and the second thermoelectric conversion member 103 (that is, are formed so that each adjacent pair of the first thermoelectric conversion member 102 and the second thermoelectric conversion member 103 are not electrically connected to each other). Further, as shown in FIG. 16, the holding by the holding section is released, and the first thermoelectric conversion member 102 and the second thermoelectric conversion member 103 are alternately arranged side by side. Then, as shown in FIG. 17, the electrodes 124a of each adjacent pair of the first thermoelectric conversion member 102 and the second thermoelectric conversion member 103 are electrically connected to each other, and also the electrodes 124b of each adjacent pair of the first thermoelectric conversion member 102 and the second thermoelectric conversion member 103 are electrically connected to each other. Thereby, each connection section 125 as a connection electrode is formed. That is, the connection step is performed, in which the electrodes 124a of each adjacent pair of the first thermoelectric conversion member 102 and the second thermoelectric conversion member 103 are electrically connected to each other, and in which the electrodes 124b of each adjacent pair of the first thermoelectric conversion member 102 and the second thermoelectric conversion member 103 are electrically connected to each other. The connection section 125 may be formed by, for example, spot welding.

Through the above steps, a thermoelectric conversion element 130 according to the present embodiment is formed.

Figure 18:
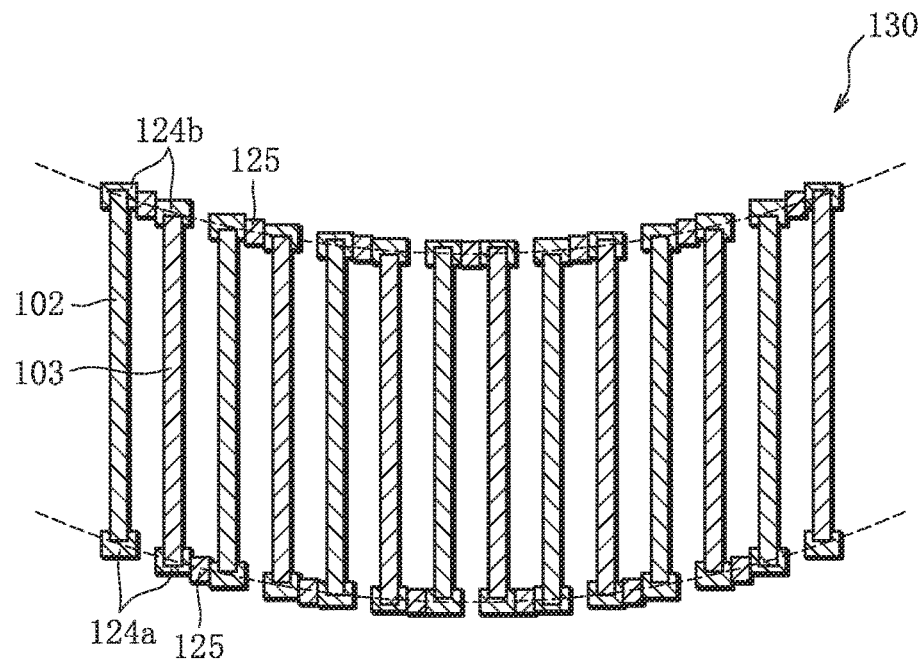
FIG. 18 is a schematic sectional view in a manufacturing step of the thermoelectric conversion element shown similarly to FIG. 9.

Further, as shown in FIG. 18, when the first thermoelectric conversion member 102 and the second thermoelectric conversion member 103 are alternately arranged side by side, the trajectory formed by mutually connecting the electrodes 124a, and the trajectory formed by mutually connecting the electrodes 124b may be curved (as shown by broken lines in FIG. 18) so that a curved electrode is formed by mutually connecting the first thermoelectric conversion member 102 and the second thermoelectric conversion member 103. That is, each of the surface shape formed by mutually connecting the surfaces of the electrodes 124a and the surface shape formed by mutually connecting the surfaces of the electrodes 124b may be curved.

In the manufacturing method of the thermoelectric conversion element 130 of the present embodiment, the first thermoelectric conversion member 102 and the second thermoelectric conversion member 103, each of which is provided with the electrodes 124a and 124b, are manufactured to be electrically separated from each other. Then, the electrodes 124a of each adjacent pair of the first thermoelectric conversion member 102 and the second thermoelectric conversion member 103 are electrically connected to each other by spot welding, or the like, and also the electrodes 124b of each adjacent pair of the first thermoelectric conversion member 102 and the second thermoelectric conversion member 103 are electrically connected to each other by spot welding, or the like. When such manufacturing step is used, each adjacent pair of the first thermoelectric conversion member 102 and the second thermoelectric conversion member 103 can be electrically connected to each other in the state where each adjacent pair of the electrodes 124a are surely connected to each other, and also each adjacent pair of the electrodes 124b are surely connected to each other. Further, by using such manufacturing step, the shape of the thermoelectric conversion element 130 can be manufactured to have an arbitrary shape.

Embodiments of the Present Invention a. The manufacturing method of the thermoelectric conversion element according to Embodiment 1 of the present invention is characterized by includes: a holding step of holding at least one thermoelectric conversion member while exposing at least one side end portion of the at least one thermoelectric conversion member; a coating step of coating the exposed end portion of the thermoelectric conversion member with metal powder; and an electrode forming step of forming an electrode at the end portion of the thermoelectric conversion member by sintering the metal powder.

The manufacturing method of the thermoelectric conversion element according to Embodiment 2 of the present invention is characterized in that, in the manufacturing method of the thermoelectric conversion element according to Embodiment 1, a plurality of the thermoelectric conversion members are arranged side by side in the holding step, and each adjacent pair of end portions of the thermoelectric conversion members are electrically connected to each other with the electrode in the electrode forming step.

The manufacturing method of the thermoelectric conversion element according to Embodiment 3 of the present invention is characterized in that, in the holding step in the manufacturing method of the thermoelectric conversion element according to Embodiment 2, one side end surfaces of the plurality of thermoelectric conversion members are arranged on the same plane, and the other end surface side of the plurality of thermoelectric conversion members are exposed.

The manufacturing method of the thermoelectric conversion element according to Embodiment 4 of the present invention is characterized in that, in the holding step in the manufacturing method of the thermoelectric conversion element according to Embodiment 3, the plurality of thermoelectric conversion members are held by a holding section having openings into which the plurality of thermoelectric conversion members are fittingly inserted so that the bottom surfaces of the plurality of thermoelectric conversion members are arranged on the same plane.

The manufacturing method of the thermoelectric conversion element according to Embodiment 5 of the present invention is characterized in that, in the holding step in the manufacturing method of the thermoelectric conversion element according to Embodiment 3, the plurality of thermoelectric conversion members are held by a holding section that includes: a fitting insertion section having through holes into which the plurality of thermoelectric conversion members are fittingly inserted; and a positioning section which is fittingly inserted into the fitting insertion section and is brought into contact with the plurality of thermoelectric conversion members so that end surfaces of the plurality of thermoelectric conversion members are positioned on the same plane.

The manufacturing method of the thermoelectric conversion element according to Embodiment 6 of the present invention is characterized in that, in the holding process in the manufacturing method of the thermoelectric conversion element according to Embodiment 1, the thermoelectric conversion members are held while the both end portions of each of the thermoelectric conversion members are exposed.

The manufacturing method of the thermoelectric conversion element according to Embodiment 7 of the present invention is characterized in that, in the manufacturing method of the thermoelectric conversion element according to Embodiment 6, the electrode forming step includes a connection step in which separate electrodes are formed at both ends of each of the plurality of thermoelectric conversion members, and in which, when the holding of the plurality of thermoelectric conversion members is released, and when the plurality of thermoelectric conversion members are arranged side by side, the electrodes of each adjacent pair of the thermoelectric conversion members are electrically connected to each other.

Further, the thermoelectric conversion element according to Embodiment 8 of the present invention includes the plurality of thermoelectric conversion members arranged side by side, and an electrode bonded to each of both end portions of the plurality of thermoelectric conversion members, and is configured such that at least one of the electrodes bonded to both end portions of each of the thermoelectric conversion members is formed by sintering metal powder provided to coat the end portion of the thermoelectric conversion members.

The thermoelectric conversion element according to Embodiment 9 of the present invention is characterized in that, in the thermoelectric conversion element according to Embodiment 8, the electrode mutually electrically connects each adjacent pair of end portions of the thermoelectric conversion members.

The thermoelectric conversion element according to Embodiment 10 of the present invention is characterized in that, in the thermoelectric conversion element according to Embodiment 9, one side end surfaces of the plurality of thermoelectric conversion members are arranged on the same plane, and the electrodes bonded to the other side end surfaces of the plurality of thermoelectric conversion members are formed by sintering the metal powder.

The thermoelectric conversion element according to Embodiment 11 of the present invention is characterized in that, in the thermoelectric conversion element according to Embodiment 9, the electrode bonded to each of both end portions of the thermoelectric conversion member is formed by sintering the metal powder provided to coat the end portions of the thermoelectric conversion member.

The thermoelectric conversion element according to Embodiment 12 of the present invention is characterized in that, in the thermoelectric conversion element according to Embodiment 8, the thermoelectric conversion element has connection section in which the electrodes bonded to both end portions of each adjacent pair of the thermoelectric conversion members are electrically connected to each other.

The thermoelectric conversion element according to Embodiment 13 of the present invention is characterized in that, in the thermoelectric conversion element according to Embodiment 12, the surface shape formed by the surfaces of the electrodes is curved.

EXPLANATION OF REFERENCE SIGNS

1 Thermoelectric conversion element
2 First thermoelectric conversion member
2a First end portion
2b Second end portion
3 Second thermoelectric conversion member
3a First end portion
3b Second end portion
4a, 4b Electrode
10 Manufacturing apparatus
11 Holding section
11a Opening
11b Concave section
12 Electrode sintering punch
13 Metal powder
14 Main body section
15 Main connection section
16 Auxiliary connection section
17 Support base

The invention claimed is:
1. A manufacturing method of a thermoelectric conversion element comprising:
   a preparing step of preparing a holding section provided with a space including a concave section or a through hole into which metal powder is put to form an electrode, while holding at least one thermoelectric conversion member;
   a holding step of holding the at least one thermoelectric conversion member by the holding section in a state in which at least one end portion of the at least one thermoelectric conversion member, which includes an end surface and a wall surface adjacent to the end surface, protrudes to be exposed to the space;
   a coating step of coating the exposed end portion of the thermoelectric conversion member with metal powder by putting the metal powder into the space; and
   an electrode forming step of forming an electrode at the end portion of the thermoelectric conversion member by sintering the metal powder.
2. The manufacturing method of the thermoelectric conversion element according to claim 1, wherein
   a plurality of the thermoelectric conversion members are arranged side by side in the holding step, and each adjacent pair of end portions of the thermoelectric conversion members are electrically connected to each other with the electrode in the electrode forming step.

3. The manufacturing method of the thermoelectric conversion element according to claim 2, wherein, in the holding step, end surfaces on a first side of each of the plurality of thermoelectric conversion members are arranged on the same plane and end surfaces on a second side of each of the plurality of thermoelectric conversion members are exposed.

4. The manufacturing method of the thermoelectric conversion element according to claim 3, wherein, in the holding step, the plurality of the thermoelectric conversion members are held by a holding section having openings into which the plurality of thermoelectric conversion members are fittingly inserted and bottom surfaces of the plurality of thermoelectric conversion members are arranged on the same plane.

5. The manufacturing method of the thermoelectric conversion element according to claim 3, wherein, in the holding step, the plurality of the thermoelectric conversion members are held by a holding section that includes:
 a fitting insertion section having through holes into which the plurality of thermoelectric conversion members are fittingly inserted; and
 a positioning section which is fittingly inserted into the fitting insertion section and is brought into contact with the plurality of thermoelectric conversion members to position the plurality of thermoelectric conversion members so that end surfaces on the first side of each of the plurality of thermoelectric conversion members are positioned on the same plane.

6. The manufacturing method of the thermoelectric conversion element according to claim 1, wherein, in the holding step, the at least one thermoelectric conversion member is held while both end portions of the at least one thermoelectric conversion member are exposed.

7. The manufacturing method of the thermoelectric conversion element according to claim 6, wherein the at least one thermoelectric conversion member comprises a plurality of thermoelectric conversion members,
 wherein, in the electrode forming step, the electrodes are separately formed at both ends of each of the plurality of the thermoelectric conversion members,
 the manufacturing method further comprising a connection step of releasing the holding of the plurality of thermoelectric conversion members and arranging side by side the plurality of thermoelectric conversion members to mutually electrically connect the electrodes of each adjacent pair of the thermoelectric conversion members.

* * * * *